United States Patent
Zhao et al.

(10) Patent No.: US 7,020,860 B1
(45) Date of Patent: Mar. 28, 2006

(54) METHOD FOR MONITORING AND IMPROVING INTEGRATED CIRCUIT FABRICATION USING FPGAS

(75) Inventors: Joe W. Zhao, San Jose, CA (US); Xiao-Yu Li, Palo Alto, CA (US); Feng Wang, San Jose, CA (US); Zhi-Min Ling, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 15 days.

(21) Appl. No.: 10/808,737

(22) Filed: Mar. 24, 2004

(51) Int. Cl.
*G06F 17/50* (2006.01)
(52) U.S. Cl. .............................. 716/5; 716/4
(58) Field of Classification Search ................ 716/1–6, 716/19; 324/763, 765
See application file for complete search history.

(56) References Cited

U.S. PATENT DOCUMENTS

| | | | |
|---|---|---|---|
| 6,427,222 B1 * | 7/2002 | Shau ............................ 716/4 |
| 6,507,942 B1 * | 1/2003 | Calderone et al. ............ 716/16 |
| 6,636,064 B1 * | 10/2003 | Satya et al. ................. 324/763 |
| 6,825,052 B1 * | 11/2004 | Eldridge et al. .............. 438/15 |
| 2003/0229875 A1 * | 12/2003 | Smith et al. .................. 716/10 |

OTHER PUBLICATIONS

Li, Xiao-Yu et al.; "An Effective Method of Characterization Poly Gate CD Variation and it's Impact on Product Performance and Yield," Semiconductor Manufacturing, 2003 IEEE International Symposium, Sep. 2, 2003, pp 259-262, available from IEEE, 3 Park Avenue, 17th Floor, New York, NY 10016-5997.

* cited by examiner

*Primary Examiner*—Matthew Smith
*Assistant Examiner*—Binh Tat
(74) *Attorney, Agent, or Firm*—Justin Liu (57) ABSTRACT

Methods for monitoring and improving the fabrication process of integrated circuits using configurable devices are described. In one aspect, the method includes instantiating a test pattern on one or more configurable devices fabricated using the fabrication process, identifying an underperforming region of the configurable devices, and determining if the underperforming region is layout sensitive. At least one of the fabrication process and the layout of the configurable device can then be adjusted based on the determination. In some embodiments, the configurable device may be a programmable logic device, such as a field programmable logic array.

21 Claims, 5 Drawing Sheets

METHOD FOR MONITORING AND IMPROVING INTEGRATED CIRCUIT FABRICATION USING FPGAS

FIELD OF THE INVENTION

The invention relates to fabrication of integrated circuits, and more particularly, to methods for monitoring and improving fabrication processes for integrated circuits.

BACKGROUND OF THE INVENTION

Integrated circuits (ICs) continue to become faster, cheaper and smaller as the fabrication processes for forming ICs improve. One challenge in the fabrication of ICs is maintaining and improving yields as the technology changes and improves. For example, technology improvements may include the use of new materials (such as copper for metal interconnects), or new techniques (such as improved etching and chemical mechanical polishing (CMP) techniques) that may have an impact on the yield of the fabrication process. It is desirable to minimize the effects on yield and thereby improve cost-efficiency.

Prior art methods for monitoring processes and improving yield have some shortcomings. For instance, a "test key," or a special test circuit, can be placed on the scribe line and used to monitor the process. The scribe line is located in an area on a wafer that is outside the area actively used by the integrated circuit being manufactured. The scribe line, however, is typically less than 10% of the total area, and therefore has limited ability to monitor the process. In particular, since the scribe line is outside the active chip area, problems occurring in the interior of the integrated circuit, especially highly localized problems, are not detected.

Other prior art techniques include running special test chips or test wafers through a process. A test chip may comprise special circuits that are useful for testing the process, and a test wafer may comprise one or more of such test chips. These techniques, however, have several disadvantages. Running a special test wafer greatly increases cost since the test wafer is only used to monitor the process, and will be discarded after serving that purpose. Typically, such test wafers are only used during development phases of the fabrication process, and not during production phases, due to this high cost. Similarly, using test chips also increases costs since the test chip occupies area on a wafer that cannot be used for actual chips. To mitigate this cost, only a sampling of wafer lots may include the test wafers, or only a small number of test chips will be used. The less frequent monitoring, however, increases the likelihood that a problem may be missed.

Another disadvantage of such techniques is that since the test chip design is not the same as the actual chip design, and in fact may be quite different, the test chip or test wafer may not detect all problems impacting yield for the actual chip designs. That is, the test chip may not be an ideal substitute for the actual chip, and yield problems may be associated with the specific circuits used in the actual design that are undetectable by the test chip. For instance, the test design and the actual design may have different metal densities that affect yield differently.

Therefore, a need exists for an accurate and cost-effective way to monitor an integrated circuit fabrication process.

SUMMARY OF THE INVENTION

An aspect of the invention is a method for monitoring and improving the fabrication process of integrated circuits using configurable devices. In one aspect, the method includes instantiating a test pattern on one or more configurable devices fabricated using the fabrication process, identifying an underperforming region of the configurable devices, and determining if the underperforming region is layout sensitive. At least one of the fabrication process and the layout of the configurable device may be adjusted based on the determination. In some embodiments, the process may include dividing each configurable device into regions. In some embodiments, the configurable device may be a programmable logic device, such as a field programmable logic array.

An aspect of the invention is a system for monitoring performance of a fabrication process for integrated circuits. The system includes a wafer comprising one or more configurable devices, each of the configurable devices including one or more regions, and a tester coupled to the wafer. The tester is configured for instantiating a test pattern in each of the regions, identifying at least one underperforming region, and determining if the underperforming region is layout sensitive.

Additional novel aspects and embodiments are described in the detailed description below. The appended claims, and not this summary, define the scope of the invention.

BRIEF DESCRIPTION OF THE DRAWINGS

The present invention is illustrated by way of example, and not by way of limitation, in the following figures, in which like reference numerals refer to similar elements.

DETAILED DESCRIPTION

The present invention is believed to be applicable to a variety of systems for manufacturing, processing and testing integrated circuits. The present invention has been found to be particularly applicable and beneficial for systems including configurable devices such as programmable logic devices having configurable logic blocks. While the present invention is not so limited, an appreciation of the present invention is presented by way of specific examples, in this instance with a programmable logic device having an array of configurable logic blocks. The specific details are set forth to provide a more thorough understanding of the present invention. However, it will be apparent to one ordinarily skilled in the art that the present invention can be practiced without these specific details. In other instances, well-known circuits and devices may be omitted or presented in abstract form in order to avoid obscuring the present invention.

In accordance with the present invention, a programmable logic device (PLD) may be used to monitor an integrated circuit (IC) fabrication process. A programmable logic device is a well-known type of digital integrated circuit that can be programmed to perform specified logic functions. One type of PLD, the field programmable gate array (FPGA), typically includes an array of configurable logic blocks (CLBS) and programmable input/output blocks (IOBs). The CLBs and IOBs are interconnected by a programmable interconnect structure. Some FPGAs also include additional resources (e.g., DLLS, memory, multipliers, processors, transceivers), which may also be configurable.

The CLBs, IOBs, interconnect, and other resources are typically programmed by loading a stream of configuration data (a bitstream) into internal configuration memory cells that define how the CLBS, IOBS, interconnect, and other resources are configured. The configuration data can be read from memory (e.g., an external PROM) or written into the FPGA by an external device. The collective states of the individual memory cells then determine the function of the FPGA.

Another type of PLD is the complex programmable logic device (CPLD). A CPLD may include two or more "function blocks" connected together and to input/output (I/O) resources by an interconnect switch matrix. Each function block of the CPLD may include a two-level AND/OR structure similar to those used in programmable logic arrays (PLAs) and programmable array logic (PAL) devices, both of which are other types of PLDs. In some CPLDs, configuration data is stored on-chip in non-volatile memory, and then downloaded to volatile memory as part of an initial configuration sequence.

For all of these programmable logic devices, the functionality of the device is controlled by data bits provided to the device for that purpose. This flexibility is one of the main advantages of a PLD. When properly configured, a PLD can be used to implement a variety of designs. This flexibility of a PLD can be exploited in monitoring an integrated circuit manufacturing process.

In accordance with the present invention, a wafer comprising one or more PLDs may be used to monitor and improve a fabrication process for integrated circuits. After fabrication, a manufacturer typically tests the die on the wafer to verify functionality and other performance characteristics. For a PLD, a manufacturer may instantiate one or more test circuits during the testing process by configuring the device. Since a PLD may be configured to implement a variety of circuits and designs, the process of testing a PLD may include configuring and reconfiguring the PLD several times. After each step of configuring of the PLD, a set of test vectors may be applied to the PLD and the results recorded. By analyzing these results, a manufacturer can determine if the PLD is functioning properly and if the PLD is performing within the performance criteria set by the manufacturer. The wafer may then be diced, and parts not meeting the manufacturer's specifications may be discarded. The remaining die may be packaged and assembled, and then tested again to ensure that no defects were missed and that no defects were introduced by the assembly and packaging process. Fully assembled parts that meet all of the performance criteria set by a manufacturer may then be sold and shipped to customers.

Figure 1:
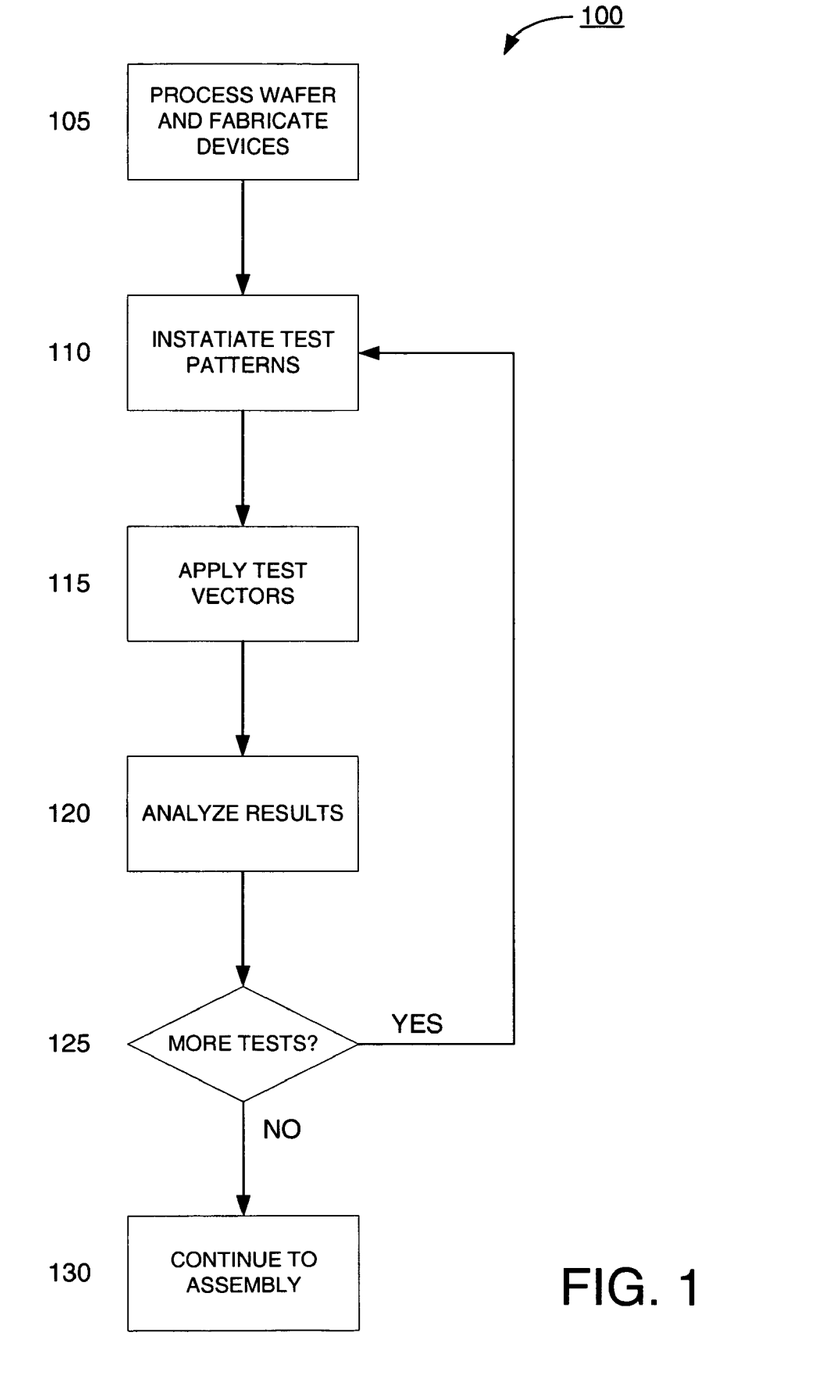
FIG. 1 shows a flow diagram including major steps in the process of fabricating and testing a programmable logic device in accordance with the present invention.

FIG. 1 shows a flow diagram including major steps in the process 100 of fabricating and testing a programmable logic device such as an FPGA in accordance with the present invention. At step 105, wafers are processed according to known techniques, forming FPGAs. After wafer processing is complete, the FPGAs are tested to ensure they meet all specifications. At step 110, pre-defined test patterns or circuits are instantiated on the FPGAs. Then at step 115, test vectors are applied to the FPGAs. At step 120, the results of applying the test vectors are analyzed. The test patterns and analysis of the results are discussed in greater detail below. At decision step 125, if more tests are to be run, the process returns to step 110 to reconfigure the FPGA with more test circuits. If all tests are completed, the process continues to step 130, where the manufacturing process for the FPGA continues. For example, if the FPGA meets the criteria set by the manufacturer, the chip may be diced from the wafer and assembled. If it does not, it may be discarded.

Figure 2:
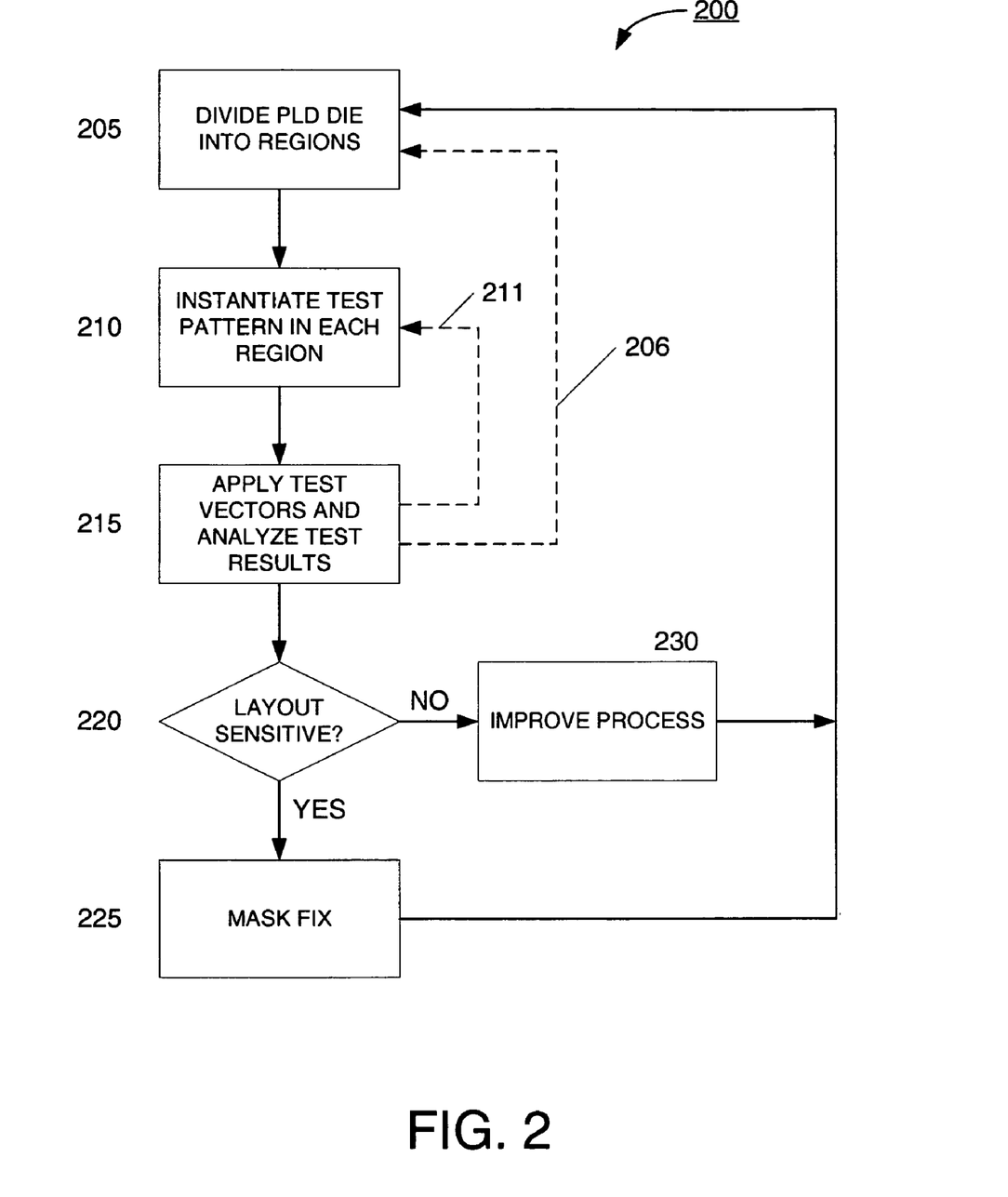
FIG. 2 shows a flow diagram for a process for improving yield in a fabrication process using an FPGA in accordance with the present invention.
Figure 3:
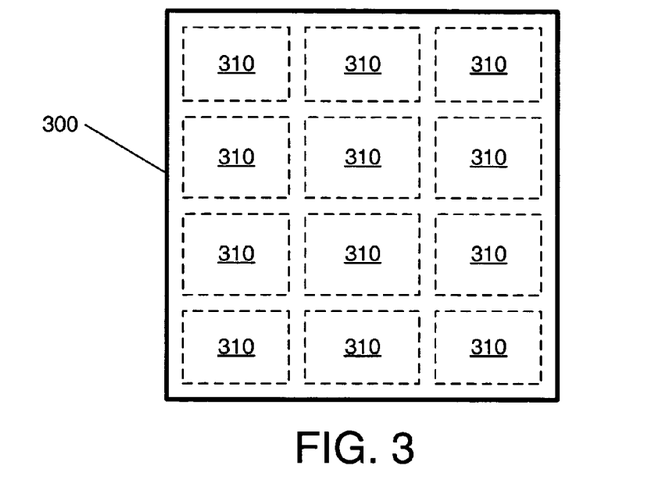
FIG. 3 shows an FPGA die that has been divided into several regions.
Figure 4A:
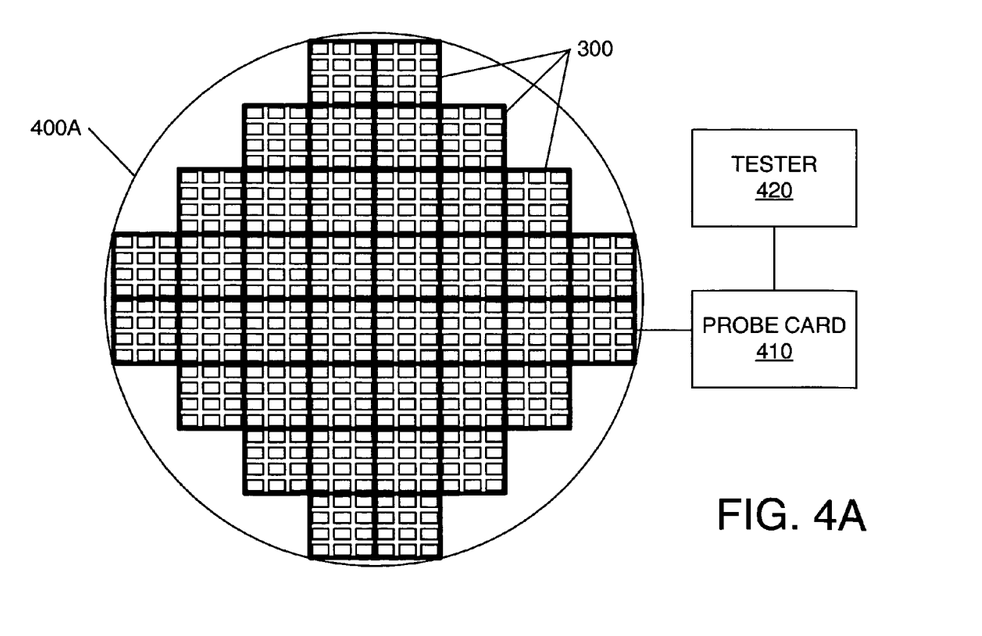
FIGS. 4A–4C show some examples of wafers in accordance with the present invention.

FIG. 2 shows a flow diagram for a process 200 for improving yield in a fabrication process using an FPGA in accordance with the present invention. At step 205, the FPGA die is divided into regions or areas. One example of this is shown in FIG. 3. FIG. 3 shows an FPGA die 300 that has been divided into several regions 310, as indicated by the dashed lines. Note that the regions 310 shown in FIG. 3 are merely an example of one possible way to divide FPGA die 300, and regions may be in any arbitrary size, shape, and position that is desirable. In particular, manufacturers may divide an FPGA die into regions based on their particular testing needs. FIG. 4A shows an example of a wafer 400A that includes multiple copies of FPGA die 300, each divided into regions. After the die has been divided into regions, test patterns or circuits are instantiated in the die in each region at step 210. As will be discussed below, the test patterns may be designed to identify potential yield issues or problems. The test patterns may also serve other purposes and test for other performance characteristics of the chip.

At step 215, test vectors are applied to the test circuits instantiated in the FPGA. The test vectors stimulate the circuits on the chip, and the results may then analyzed. For example, a known set of test vectors may be applied and the results of analyzing that set of test vectors may be compared with an expected result. Any differences between actual and expected results may indicate a problem. As another example, performance characteristics, such as frequency, delays, voltage, current, or signal quality, may also be measured and analyzed. As discussed above with respect to FIG. 1, the FPGA may be configured and reconfigured one or more times, and multiple sets of test circuits may be instantiated, and multiple sets of test vectors may be applied (as indicated by dashed arrow 211). Also, the chip may be divided into different regions in a different way to exercise different portions of the chip (also as indicated by dashed arrow 206).

At decision step 220, the test results are used to determine if the problems detected are layout sensitive. If problems are layout sensitive, the process continues to step 225 where changes may be made in the layout and the masks in order to address the problems. If the problems are not layout sensitive, then the process continues to step 230, where adjustments are made in the fabrication process to address the problems and issues. After fixing the design and/or the fabrication process, process 200 may be repeated using the improved layout or fabrication process to determine if other problems exist. As will be discussed in greater detail below, a problem may be considered layout sensitive if it correlates to something specific in the layout or design of the chip. On the other hand, a problem may be considered not to be layout sensitive if there is low correlation to the physical layout of the chip. It should be noted that both layout sensitive and non-layout sensitive problems may be determined with process 200 and may require changes in both the masks and the fabrication process.

In accordance with the present invention, a problem that is evidenced at the die level may be associated with a layout sensitive problem, and a problem that is evidenced at the wafer level may be associated with a non-layout sensitive problem. That is, if a detected problem is localized and found within an individual die, then it is more likely that the problem is related to a layout or design problem within the die. On the other hand, if a detected problem spreads across multiple die on a wafer, then it is more likely that there is a problem related to the fabrication process. Based on the knowledge of which type of problem is more likely, a manufacturer trying to improve its yield can focus on the layout or the process.

An example of a layout sensitive problem may be a metal density that is too low. A typical integrated circuit process requires that each metal layer have a certain metal density at each layer, as well as a certain distribution of that metal density. If metal density is too low, problems may occur in those areas. One way to address this problem is to add "dummy" metal in those areas. That is, extra metal lines that are not functionally used in the circuit are added to the layout of the chip in order to increase the metal density. Other layout sensitive problems and techniques for addressing them are well known in the art.

An example of a non-layout sensitive problem may be a polishing step that is uneven. Certain layers may step through a chemical mechanical polishing step during the fabrication process. If the wrong type and concentration of chemicals are used, or if the polishing is non-uniform in any way, performance problems may arise. In such instances, a manufacturer may adjust the process to account for such non-uniformities. This may mean, for example, an adjustment in the fabrication equipment being used, or an adjustment in the type and concentration of the chemicals applied. Other such process problems and techniques for addressing them are well known in the art.

Figure 4B:
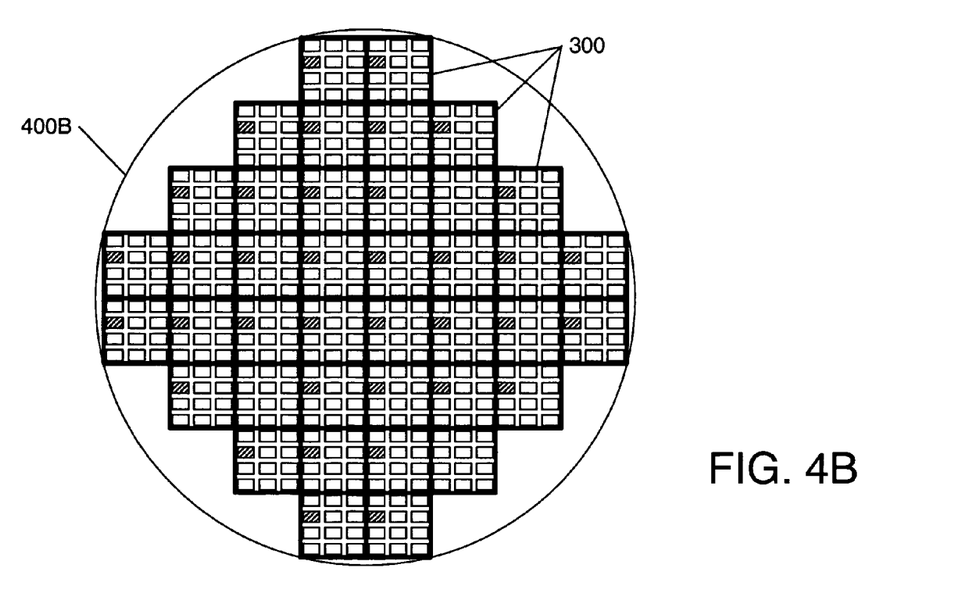
Figure 4C:
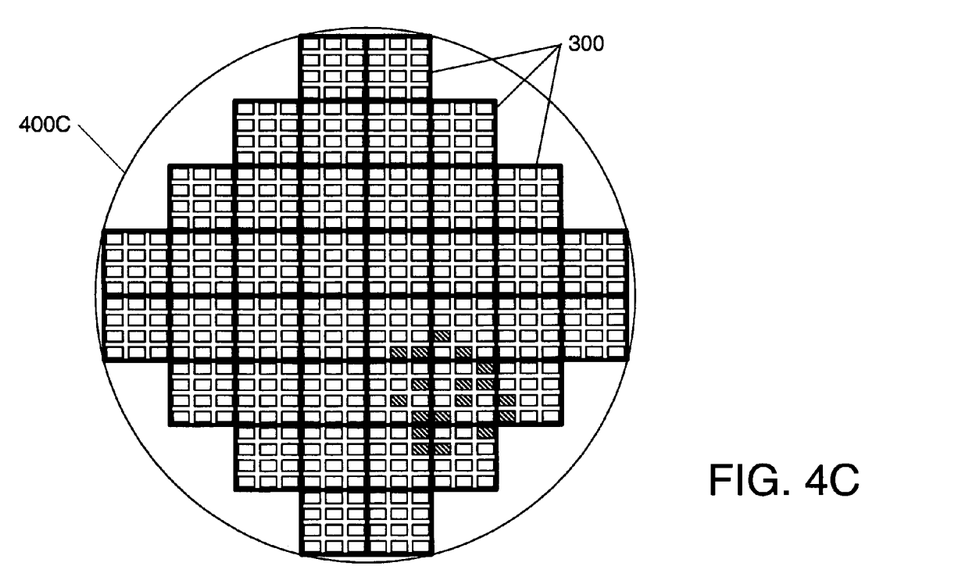

FIGS. 4A–4C show some examples of wafers in accordance with the present invention. In particular, each example wafer 400A–400C includes several PLD die 300. Each PLD die 300 is divided into regions as described above, and test circuits are instantiated in the PLD die 300. In one embodiment, each region of each die 300 is configured with the same test pattern and is then stimulated using the same test vectors. The results of testing can then be compared across each chip and across the entire wafer. In some embodiments, a probe card 410 may be used to interface to each die 300, and a tester 420 may be used to instantiate test patterns to each die 300 and apply and receive test vectors to and from each die 300. A deviation in performance of particular regions relative to the performance of other regions may indicate a problem in those particular regions. The manufacturer may use this information to determine and address the causes of the problems to improve the yield. In some cases, a particular region may perform slower or faster than other regions, or operate at higher or lower temperatures than other regions. In some other cases, a particular region may not function properly at all. Any performance that is outside criteria set by a manufacturer can indicate a problem in either the layout or the process.

For instance, FIG. 4B shows an example of a wafer 400B where certain regions are underperforming, relative to the other regions. The underperforming regions are shaded in FIG. 4B. In one example, the underperforming region may be operating at a lower maximum frequency than the other regions. Notice that the underperforming regions are all localized within each die 300. Furthermore, in this example, all of the underperforming regions are located in the same region of each die 300 (first column, second row). This is a strong indication that there is a problem that is layout sensitive. That is, since the problems are localized and highly correlated to the particular layout of the chip, the problem is most likely a result of an issue in the layout of the particular chip. As noted above, a manufacturer could then adjust the layout to address this issue. This may involve, for example, adding dummy metal.

FIG. 4C shows an example of a wafer 400C that has underperforming regions, again shown in the figure as shaded regions. Here, the underperforming regions are located in an area of the wafer that spans multiple chips. In particular, the underperforming regions are not localized within each die, and have low correlation to the layout of each die. In this example, the problem is likely to be non-layout sensitive, and is more likely to be the result of a problem in the fabrication process. In particular, in the example shown, it is likely that there is a problem with an area in the lower right-hand corner of the wafer, and thus the problem has a high correlation to the wafer itself. With this information, a manufacturer may adjust the fabrication process paying particular attention to the effects of processing on that problem area.

Performance of prior generations of integrated circuits is typically dominated by the performance of the transistors. As the feature sizes of integrated circuits have become smaller, where minimum feature size is at sub-micron and deep sub-micron dimensions, and minimum pitch is at sub-half micron and sub-quarter micron dimensions, performance is increasingly dependent on the interconnections between transistors. The metal interconnections are becoming thinner, both in height and width, leading to higher resistance, and the spacing between metal lines is decreasing, leading to higher capacitances. Higher resistance and capacitance means increased delay, which may ultimately lead to decreased performance. Furthermore, other changes in integrated circuit processing technology and techniques may affect performance of specific resources within an integrated circuit. For instance, some manufacturers have started to shift from using aluminum as the primary metal used to form interconnections to using copper, since copper has a lower resistance. Typically, aluminum interconnections are formed using etch-back procedures, while copper interconnections may be formed using chemical mechanical polishing (CMP) techniques. The CMP techniques are more generally sensitive to minor variations in the process. For example, one area of a wafer may be polished slightly more than other areas. This may result in copper interconnections in one area of the chip being slightly thinner than copper interconnections in other areas. A thinner copper metal line means its resistance increases, thereby decreasing performance.

Figure 5A:
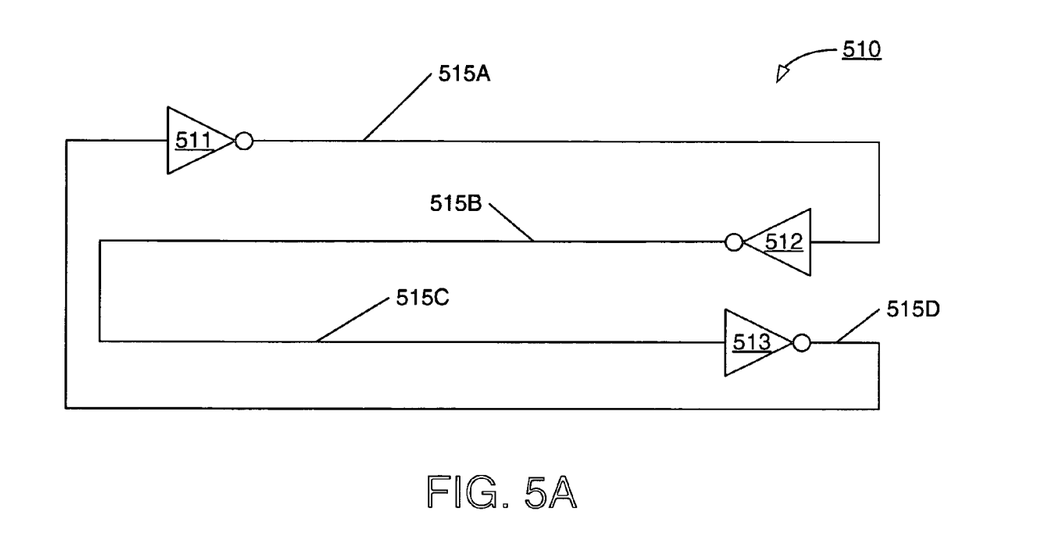
FIGS. 5A and 5B show two alternate implementations of a ring oscillator that may be used to test two aspects of an integrated circuit.
Figure 5B:
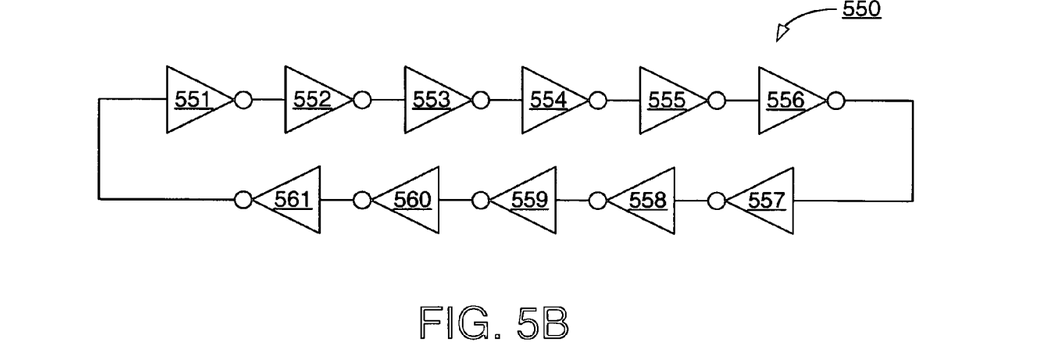

Test circuits and patterns for testing configurable devices are well known in the art. For example, one method for testing a circuit is described in U.S. Pat. No. 6,507,942 to Calderone et al., issued on Jan. 14, 2003, which is incorporated by reference herein in its entirety. In a preferred embodiment, substantially the same test patterns are instantiated in each region in order to facilitate comparing performance between regions. Test circuits and vectors may be designed to test isolated aspects of the integrated circuit to allow specific resources to be tested. For instance, the test patterns may be tailored to focus on the performance of either the transistors or the metal lines forming the interconnections between transistors. As shown in the example of FIGS. 5A and 5B, two alternate implementations of a ring oscillator may be used to test two aspects of an integrated circuit. Ring oscillator 510 of FIG. 5A includes three inverters 511–513 chained together in a ring using metal line segments 515A–515D. In a preferred embodiment, metal line segments 515A–515D are very long. In this way, the frequency of ring oscillator 510 is dominated by the performance of the metal lines. Based on a measurement of the frequency of ring oscillator 510, relative performance of the metal interconnections may be determined. In particular, by comparing the frequency of oscillators located in various regions across a die or wafer, a manufacturer can determine which regions are faster or slower, relative to each other.

In contrast, ring oscillator 550 of FIG. 5B includes eleven inverters 551–561 chained together in a ring with relatively short interconnections between each pair of inverters. In such an arrangement, the performance of ring oscillator 550 is dominated by the performance of the transistors that make up inverters 551–561, and the frequency of ring oscillator 550 will primarily be a function of the performance of those transistors. Thus, relative performance of the transistors may be determined based on the measured frequency. Other examples of test circuits may include other circuit elements, such as flip-flops, registers, look-up tables, memories, etc.

As another example, a test pattern may also be used to isolate certain layers in an integrated circuit. For instance, if the Metal-3 layer is of particular interest, a test pattern may be designed and instantiated that targets testing of that layer. For example, ring oscillator 510 of FIG. 5A may be used to target a particular layer. Ring oscillator 510 may be constructed such that each of metal interconnections 515A–515D uses primarily Metal-3 resources. This results in the performance of ring oscillator 510 being highly correlated to the performance of the Metal-3 layer. By using test patterns that target various layers, a manufacturer can identify if there is a problem with any particular layer in the processing.

Methods in accordance with the present invention have several advantages over the prior art. Since the PLDs used to monitor the process are actual chips, no area or wafers are wasted. That is, the PLDs may be first configured to instantiate the test circuits. Later, after monitoring and analyzing the process, the PLDs may be prepared and shipped to customers for use as general-purpose programmable devices. Since a PLD is programmable, the customer will be able to configure the PLD to implement other circuits. This means there is no additional cost incurred in silicon area using methods of the present invention. This is in contrast to prior art techniques which may be very costly and may require the use of large amounts of silicon area to perform the testing.

Another advantage is that every single wafer may be monitored, and wafers may be monitored even during production phases. Prior art methods required that certain wafers in a wafer lot be designated as test wafers that are typically only used during development phases. Since the prior art methods do not monitor every wafer, it is possible for certain problems to escape detection. In accordance with the methods described herein, every wafer may be monitored, substantially increasing the likelihood that a problem will be detected. The only cost is the additional test time required to implement the PLD test circuits and to run the tests. This cost, however, may be offset by the fact that these tests may also be used to verify functionality of the PLD, and may be merged with other tests normally performed by a manufacturer. That is, the tests used in accordance with the present invention may serve dual purposes and may be used to test other features of the FPGA simultaneously and at no additional cost.

Yet another advantage is that PLDs in general, and FPGAs in particular, are typically very uniform and very dense. For example, an FPGA may comprise a large regular array of configurable logic blocks. This means that highly uniform testing can be achieved using PLDs and FPGAs. After problems and issues in a fabrication process have been understood and resolved by using an FPGA, the process can then be used to process other types of integrated circuits. The lessons learned by using an FPGA may be used to reduce significantly the time, effort and cost associated with achieving production yields on other chips.

The methods of the present invention may be performed in hardware, software, or any combination thereof, as those terms are known in the art. In particular, the present methods may be carried out in conjunction with software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having ordinary skill in the relevant arts of the invention will now perceive various modifications and additions that can be made as a result of the disclosure herein. For example, the above text describes the circuits and methods of the invention in the context of programmable logic devices such as FPGAs. However, the circuits and methods of the invention can also be implemented in other configurable systems and devices.

Accordingly, all such modifications and additions are deemed to be within the scope of the invention, which is to be limited only by the appended claims and their equivalents.

What is claimed is:

1. A method for monitoring and improving a fabrication process for integrated circuits comprising:
   instantiating a test pattern on a plurality of configurable devices fabricated on a wafer using the fabrication process;
   identifying at least one underperforming region in at least one of the plurality of configurable devices;
   determining if the at least one underperforming region is layout sensitive; and
   responsive to the step of determining, adjusting at least one of layout of the at least one of the plurality of configurable devices and the fabrication process;
   wherein if the at least one underperforming region is layout sensitive, the step of adjusting comprises adjusting the layout of the at least one of the plurality of configurable devices; and
   wherein if the at least one underperforming region is not layout sensitive, the step of adjusting comprises adjusting the fabrication process.

2. The method of claim 1 further comprising:
   dividing each of the plurality of configurable devices into a plurality of regions.

3. The method of claim 2 wherein the step of instantiating a test pattern comprises instantiating a same test pattern in each of the plurality of regions.

4. The method of claim 2 wherein the step of determining comprises correlating performance of each of the plurality of regions with layout of the each of the plurality of configurable devices.

5. The method of claim 4 wherein:
if there is a high correlation, adjusting the layout of the at least one of the plurality of configurable devices; and
if there is a low correlation, adjusting the fabrication process.

6. The method of claim 2 wherein:
the step of determining comprises correlating performance of each of the plurality of regions with the wafer;
if there is a low correlation, adjusting the layout of the at least one of the plurality of configurable devices; and
if there is a high correlation, adjusting the fabrication process.

7. The method of claim 1 wherein the test pattern comprises a ring oscillator.

8. The method of claim 7 wherein the step of identifying comprises measuring a frequency of the ring oscillator.

9. The method of claim 1 wherein the step of identifying comprises measuring at least one of frequency, delay, voltage, current, and signal quality of each of the plurality of configurable devices.

10. The method of claim 1 further comprising:
tailoring the test pattern to measure performance of interconnections within the plurality of configurable devices.

11. The method of claim 10 wherein tailoring the test pattern comprises tailoring the test pattern to measure performance of a particular layer within the plurality of configurable devices.

12. The method of claim 10 wherein the interconnections are copper metal lines.

13. The method of claim 1 further comprising:
tailoring the test pattern to measure performance of transistors within the plurality of configurable devices.

14. The method of claim 1 further comprising:
applying test vectors to each of the plurality of configurable devices; and
analyzing results based on the step of applying test vectors.

15. The method of claim 1 wherein adjusting the layout of the at least one of the plurality of configurable devices comprises adding dummy metal.

16. The method of claim 1 further comprising:
after the step of adjusting, repeating the steps of instantiating, identifying and determining.

17. The method of claim 1 wherein the test pattern is also used during the normal testing of the plurality of configurable devices.

18. The method of claim 1 wherein the plurality of configurable devices comprises a programmable logic device.

19. The method of claim 18 wherein the programmable logic device is a field programmable logic array.

20. The method of claim 1 further comprising:
after the step of adjusting, fabricating an integrated circuit different from the plurality configurable devices using the fabrication process.

21. A system comprising:
means for instantiating a test pattern on a plurality of configurable devices fabricated on a wafer using a fabrication process;
means for identifying at least one underperforming region in at least one of the plurality of configurable devices;
means for determining if the at least one underperforming region is layout sensitive; and
means for adjusting at least one of layout of the at least one of the plurality of configurable devices and the fabrication process, responsive to the means for determining;
wherein if the at least one underperforming region is layout sensitive, the means for adjusting adjusts the layout of the at least one of the plurality of configurable devices; and
wherein if the at least one underperforming region is not layout sensitive, the means for adjusting adjusts the fabrication process.

* * * * *